United States Patent
Rush et al.

(10) Patent No.: US 10,230,247 B2
(45) Date of Patent: Mar. 12, 2019

(54) SYSTEM AND METHOD FOR INCREASING ALLOWABLE SYSTEM CURRENT IN ENERGY STORAGE SYSTEM

(71) Applicant: General Electric Company, Schenectady, NY (US)

(72) Inventors: Kenneth McClellan Rush, Ballston Spa, NY (US); Richard Scott Bourgeois, Albany, NY (US); David Eugene James, Schenectady, NY (US); Joshua Paul Webb, Schenectady, NY (US); Mark Edward Gotobed, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 72 days.

(21) Appl. No.: 15/230,613

(22) Filed: Aug. 8, 2016

(65) Prior Publication Data

US 2018/0041051 A1 Feb. 8, 2018

(51) Int. Cl.
*H02J 7/00* (2006.01)
*G01R 31/36* (2019.01)
(Continued)

(52) U.S. Cl.
CPC ............ *H02J 7/0021* (2013.01); *G01R 31/36* (2013.01); *H02J 3/32* (2013.01); *H02J 3/387* (2013.01);
(Continued)

(58) Field of Classification Search
CPC ........ H02J 7/0021; H02J 7/0024; H02J 7/007; H02J 7/04; H02J 2007/0067
(Continued)

(56) References Cited

U.S. PATENT DOCUMENTS 6,919,707 B2 7/2005 Kawai et al.
2006/0103348 A1* 5/2006 Melichar ............ G01R 31/3651
320/116
(Continued)

FOREIGN PATENT DOCUMENTS

EP 3 011 655 A1 4/2016

OTHER PUBLICATIONS

Pending U.S. Appl. No. 14/975,936, filed Dec. 21, 2015.
(Continued)

*Primary Examiner* — Zixuan Zhou
(74) *Attorney, Agent, or Firm* — Dority & Manning, P.A.

(57) ABSTRACT

The present disclosure is directed to a system and method for controlling an energy storage system. The energy storage system includes a plurality of parallel-connected energy storage devices. The method includes determining, by one or more controllers, a limiting energy storage device based at least in part on a current rating for the limiting energy storage device. The method includes determining, by the one or more controllers, an adjusted allowable system current based at least in part on modifying one or more operational parameters of the limiting energy storage device. The method includes determining, by the one or more controllers, a modified operational parameter of the limiting energy storage device to increase the allowable system current of the energy storage system. The method includes controlling the limiting energy storage device based at least in part on the modified operational parameter.

20 Claims, 6 Drawing Sheets

(51) Int. Cl.
*H02J 3/32* (2006.01)
*H02J 3/38* (2006.01)
*H02J 7/34* (2006.01)
*H02J 1/00* (2006.01)

(52) U.S. Cl.
CPC ............... *H02J 7/007* (2013.01); *H02J 7/34* (2013.01); *H02J 2001/004* (2013.01)

(58) Field of Classification Search
USPC ...................... 320/101, 126, 157, 159, 164
See application file for complete search history.

(56) References Cited

U.S. PATENT DOCUMENTS

| | | |
|---|---|---|
| 2009/0212626 A1 | 8/2009 | Snyder et al. |
| 2014/0184166 A1* | 7/2014 | Ohkawa .............. H01M 10/441 320/134 |
| 2016/0033178 A1 | 2/2016 | Chuah et al. |
| 2016/0043580 A1 | 2/2016 | Rush, Jr. et al. |

OTHER PUBLICATIONS

International Search Report and Written Opinion issued in connection with corresponding PCT Application No. PCT/US2017/45434, dated Oct. 23, 2017.

\* cited by examiner

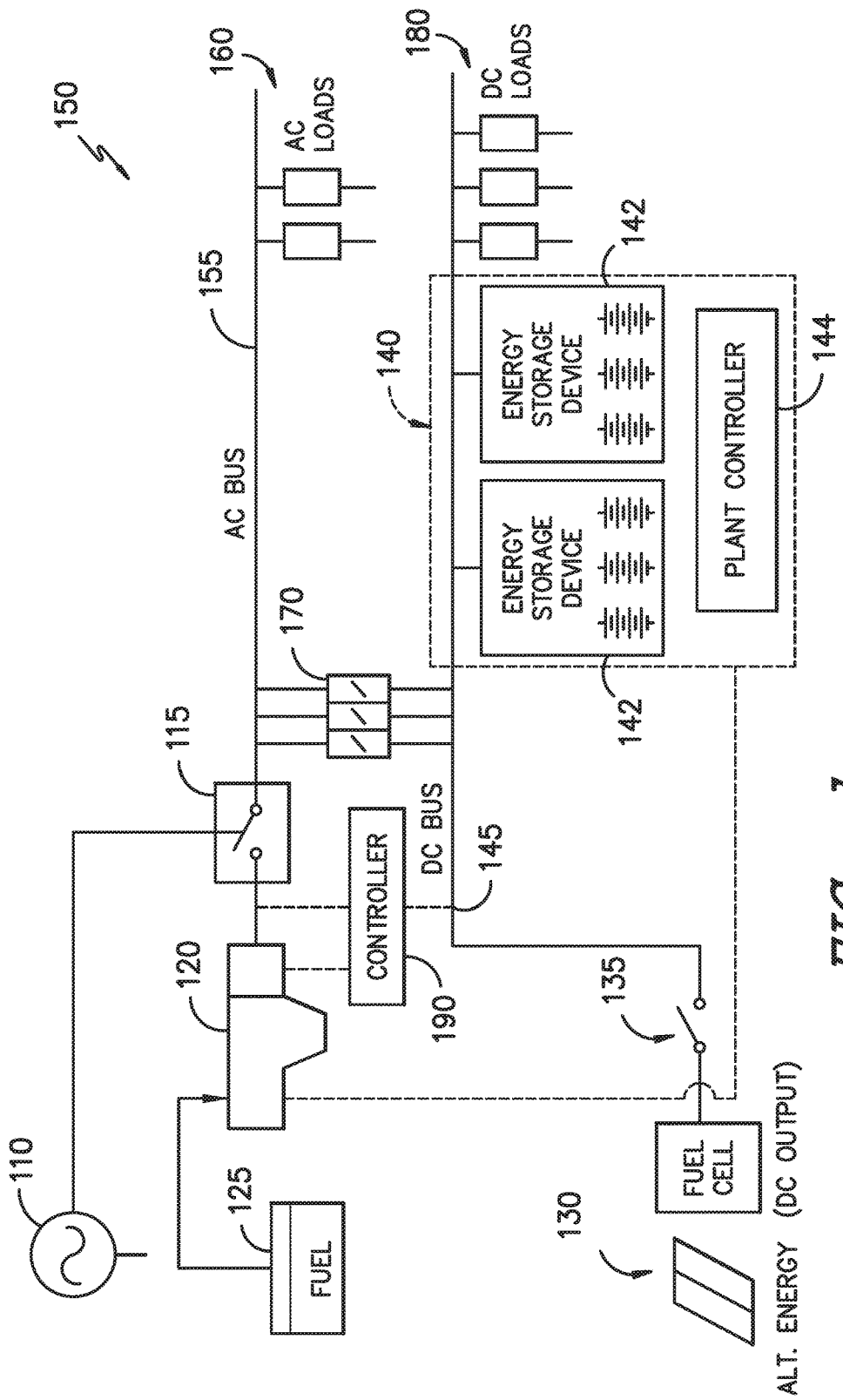
FIG. -1-

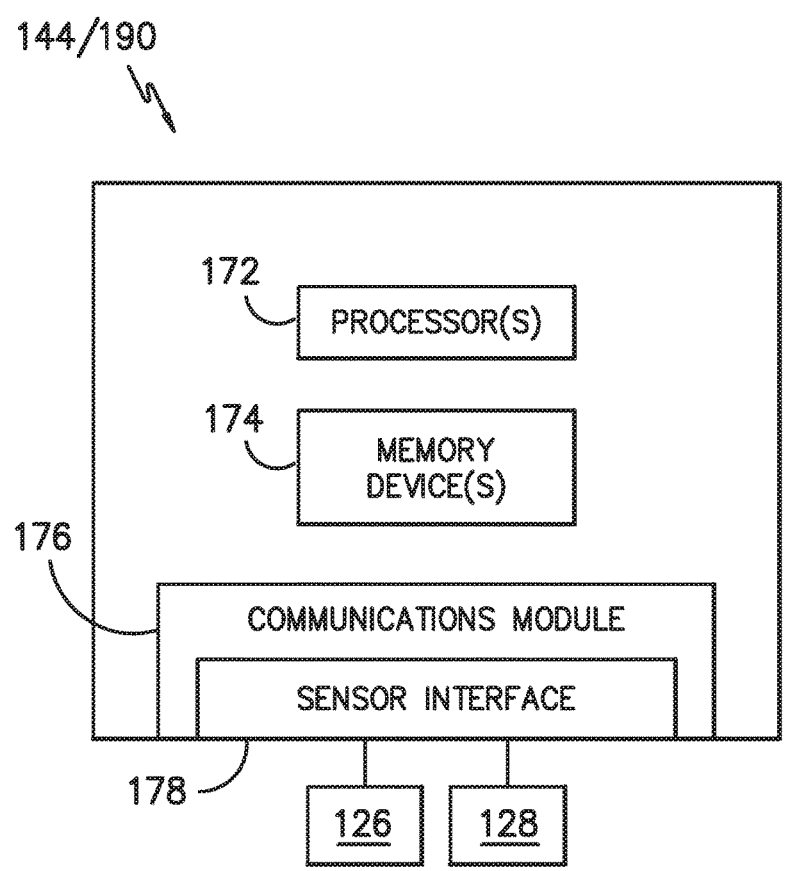
FIG. -2-

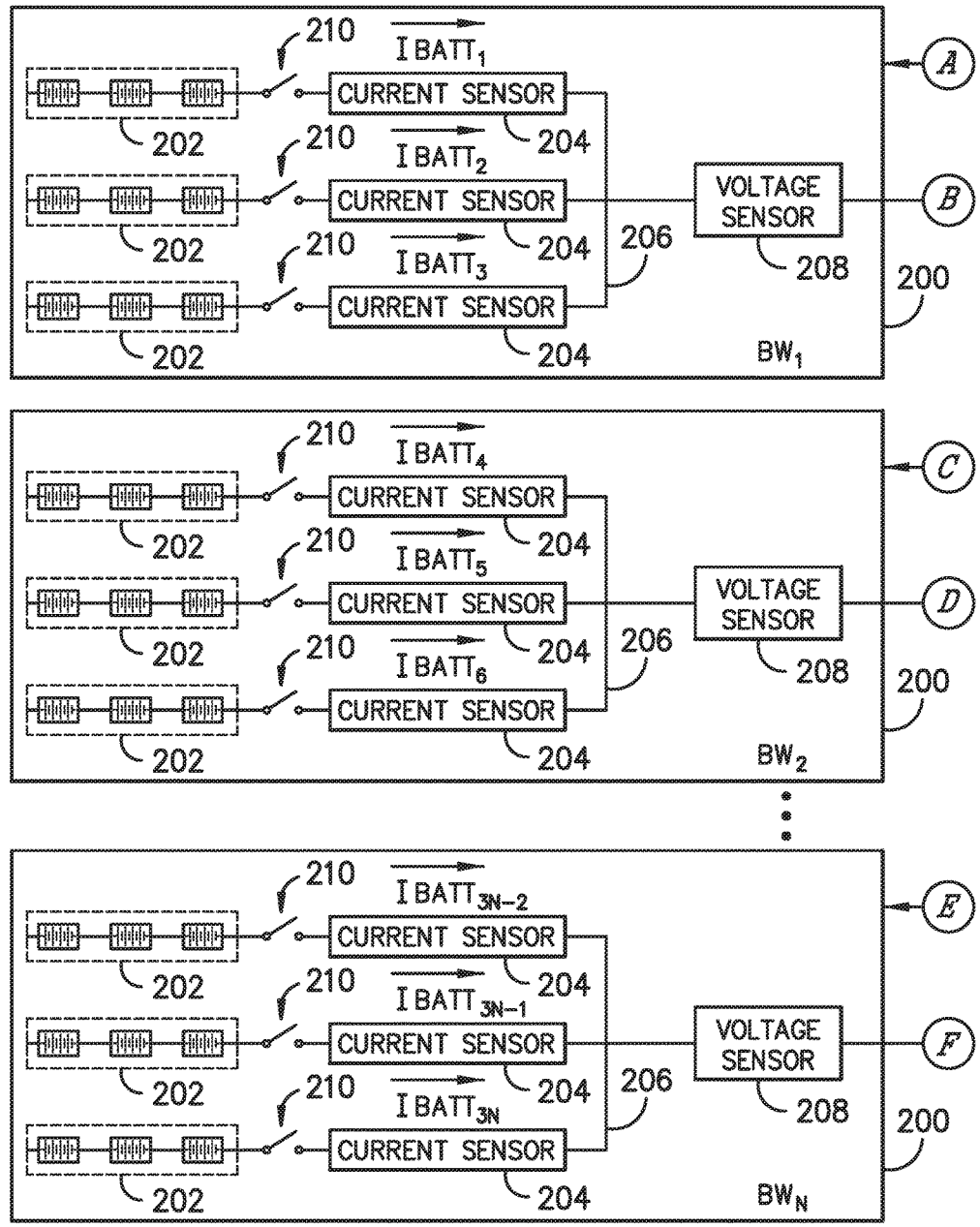
FIG. -3A-

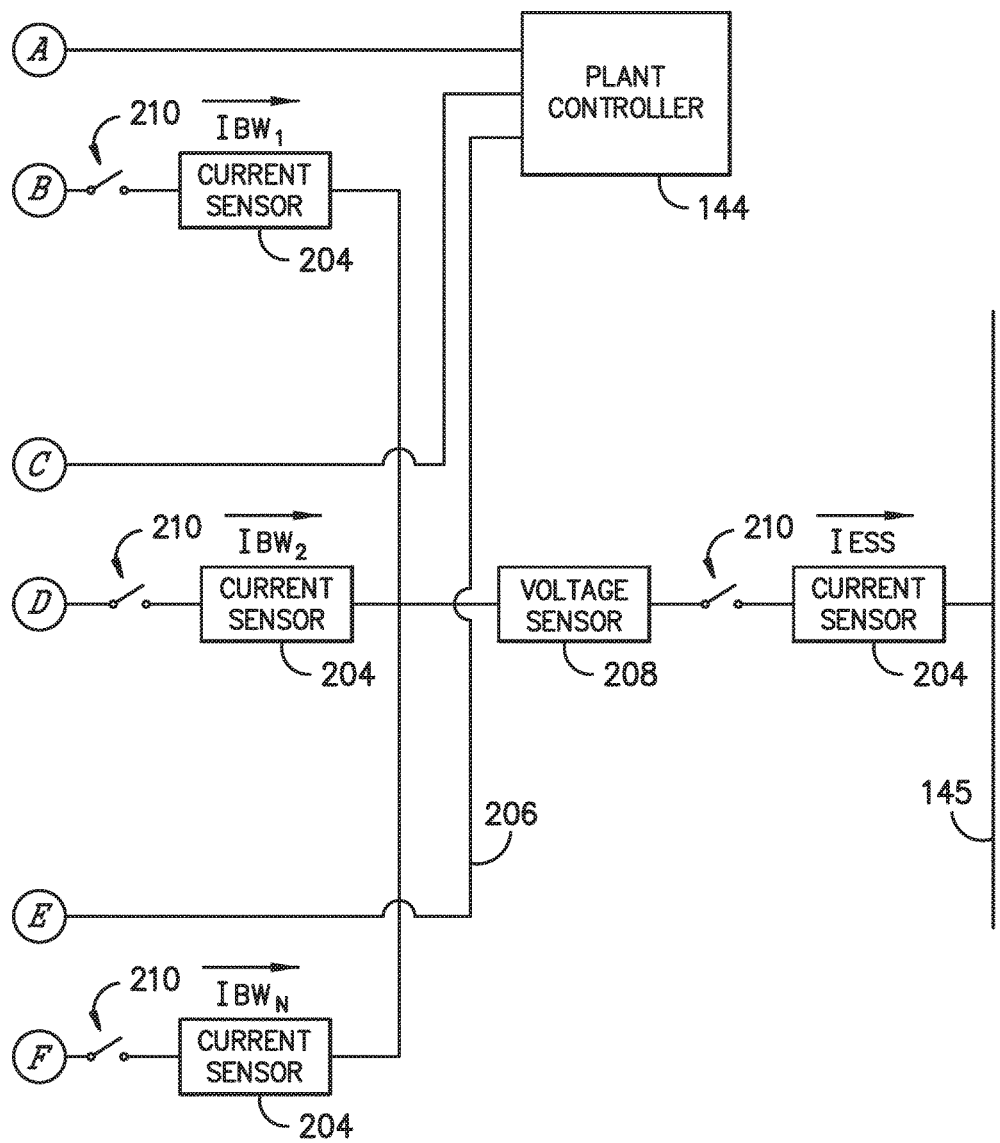
FIG. -3B-

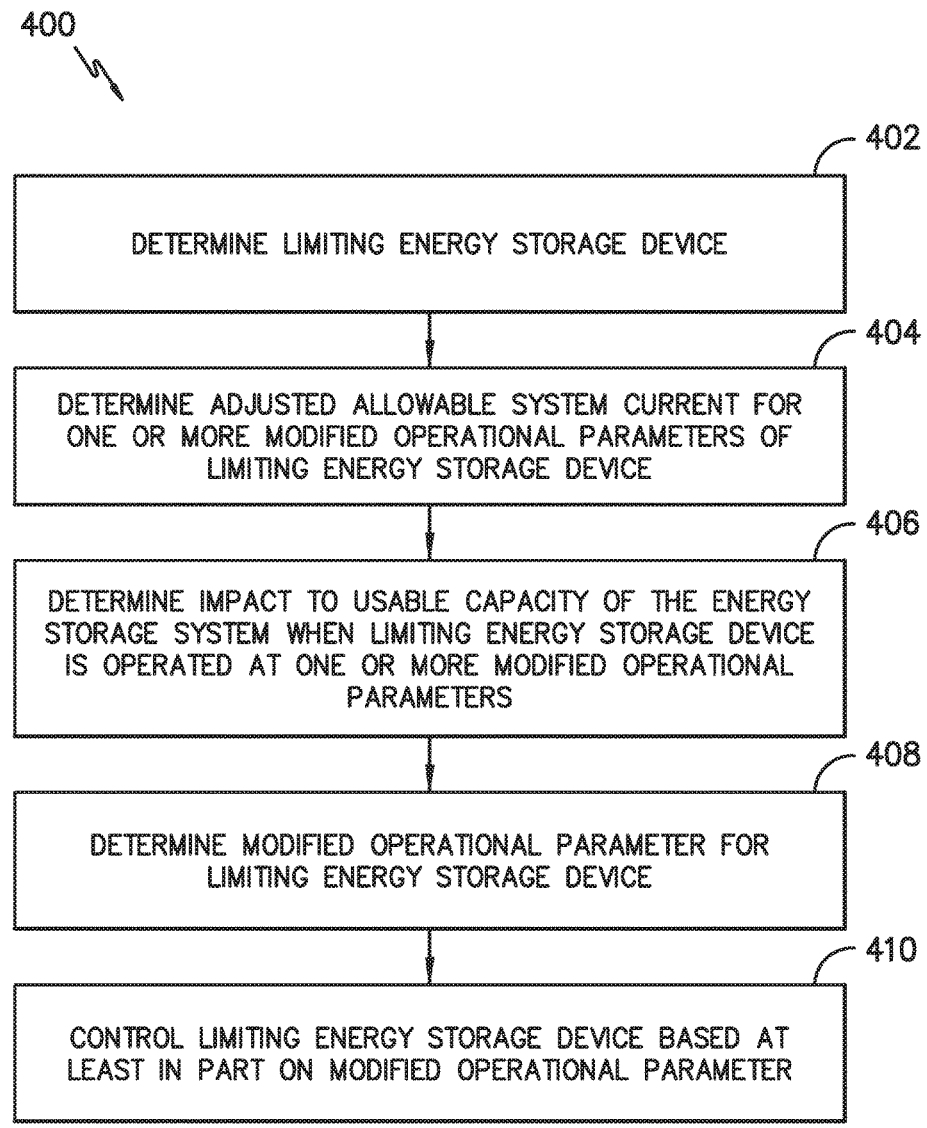
FIG. -4-

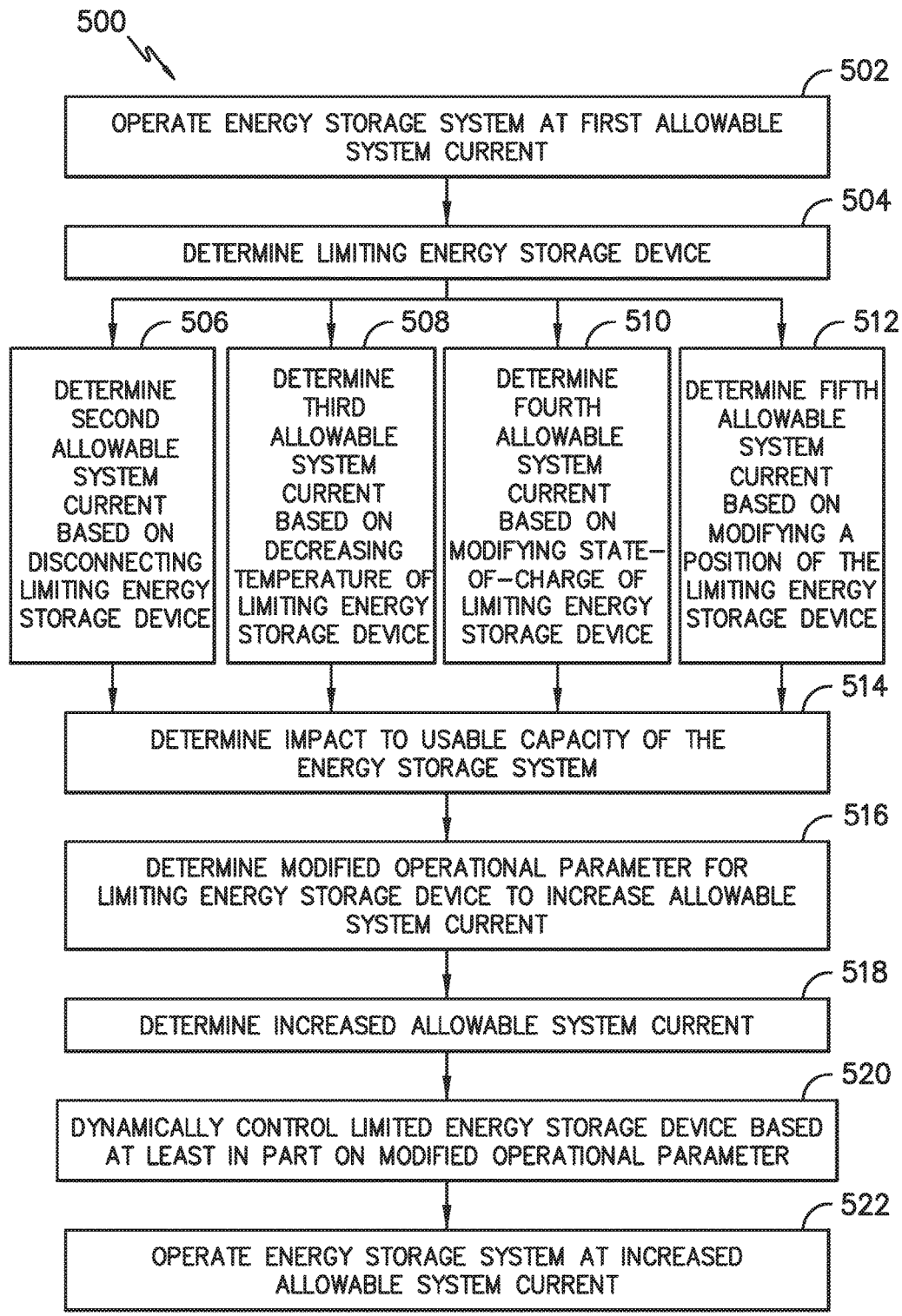
FIG. -5-

SYSTEM AND METHOD FOR INCREASING ALLOWABLE SYSTEM CURRENT IN ENERGY STORAGE SYSTEM

FIELD OF THE INVENTION

The present subject matter relates generally to energy storage systems and, more particularly, to systems and methods for increasing the allowable system current in an energy storage system without compromising system protection devices.

BACKGROUND OF THE INVENTION

Energy storage systems, such as power conditioning systems, are used in a variety of applications, such as providing emergency back-up power or providing consistent power from variable energy sources, such as wind, solar, or other variable energy sources. These energy storage systems can include different energy storage devices, such as parallel-connected battery wings or battery strings. In such applications, a plurality of battery wings are commonly connected in parallel, with each battery wing including a plurality of parallel-connected battery strings. In such a system, a controller, such as a plant controller, typically constrains operation of the battery wings or battery strings based upon the allowable system current rating provided by the plant controller. The allowable system current can be dynamically determined based on the available current capacity for individual battery strings. For example, if an individual battery string is approaching its current rating, the plant controller can reduce the allowable system current for the system to prevent the individual battery string from exceeding its current rating.

Due to the nature of a parallel-connected energy storage system, individual energy storage devices can contribute unequal currents to total current of the energy storage system. For example, as individual energy storage devices degrade over time, or as the operational characteristics of an energy storage device are varied, such as a state-of-charge or temperature, the resistance of an energy storage device can differ from the resistance of other energy storage devices connected to the system. In such a case, an individual energy storage device operating at the same voltage as all other energy storage devices connected to a common bus will have a varied current based on the resistance of the energy storage device. Thus, energy storage devices with lower resistances will contribute higher currents to the total current of the energy storage system, which can cause an individual energy storage device to approach its current rating before the other connected energy storage devices approach their respective current rating. To account for this current discrepancy, a typical solution for preventing any individual energy storage device from operating at a current greater than its current rating is for a controller, such as a plant controller, to derate, or reduce, the allowable system current for the energy storage system. For example, if an individual string is operating at or close to its current rating, the plant controller can reduce the allowable system current of the system to a level that will prevent the individual string from exceeding the current rating. However, derating the allowable system current for the energy storage system can reduce the total power that can be delivered by the energy storage system. Further, when the allowable system current for the system is limited by a single energy storage device, the energy storage system may be unable to meet the energy demands required of the system.

BRIEF DESCRIPTION OF THE INVENTION

Aspects and advantages of the invention will be set forth in part in the following description, or may be obvious from the description, or may be learned through practice of the invention.

In one aspect, the present disclosure is directed to a method for controlling an energy storage system. The energy storage system includes a plurality of parallel connected energy storage devices. The method can include determining, by one or more controllers, a limiting energy storage device based at least in part on a current rating for the limiting energy storage device. The method can include determining, by the one or more controllers, an adjusted allowable system current based at least in part on modifying one or more operational parameters of the limiting energy storage device. The method can include determining, by the one or more controllers, a modified operational parameter of the limiting energy storage device to increase the allowable system current of the energy storage system. The method can include controlling the limiting energy storage device based at least in part on the modified operational parameter.

In another aspect, the present disclosure is directed to an energy storage system. The energy storage system can include plurality of energy storage devices connected in parallel. Each of the energy storage devices can be a battery wing or a battery string. Each battery wing can include a plurality of parallel connected battery strings. The energy storage system can include a controller communicatively coupled to the plurality of energy storage devices. The controller can be configured to perform one or more operations. The one or more operations can include determining a limiting energy storage device based at least in part on a current rating for the limiting energy storage device. The one or more operations can include determining an adjusted allowable system current based at least in part on modifying one or more operational parameters of the limiting energy storage device. The one or more operations can include determining a modified operational parameter of the limiting energy storage device to increase the allowable system current of the energy storage system. The one or more operations can include controlling the limiting energy storage device based at least in part on the modified operational parameter.

In yet another aspect, the present disclosure is directed to a control system for controlling an energy storage system. The energy storage system can include a plurality of parallel-connected energy storage devices. The control system can include one or more processors and one or more memory devices. The one or more memory devices can store instructions that when executed by the one or more processors cause the one or more processors to perform operations. The operations can include operating the energy storage system at a first allowable system current. The operations can include determining, by one or more controllers, a limiting energy storage device based at least in part on a current rating for the limiting energy storage device. The operations can include determining, by the one or more controllers, a second allowable system current based at least in part on disconnecting the limiting energy storage device from the energy storage system. The operations can include determining, by the one or more controllers, a third allowable system current based at least in part on decreasing a temperature of the limiting energy storage device. The operations can include determining, by the one or more controllers, a fourth allowable system current based at least in part on modifying a state-of-charge of the limiting energy storage device. The operations can include determining, by the one or more controllers, a modified operational parameter for the limiting energy storage device such that the allowable system current at the modified operational parameter is increased compared to the first allowable system current. The operations can include determining, by the one or more controllers, an increased allowable system current for the energy storage system. The operations can include dynamically controlling, by the one or more controllers, the limiting energy storage device based at least in part on the modified operational parameter. The operations can include operating the energy storage system at the increased allowable system current.

It should be understood that the system may further include any of the additional features as described herein. These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a schematic diagram of one embodiment of an electrical power system according to example aspects of the present disclosure;

FIG. 2 illustrates a block diagram of one embodiment of suitable components that may be configured in a controller according to example aspects the present disclosure;

FIG. 3A illustrates a portion of a schematic diagram of one embodiment of an energy storage system according to example aspects of the present disclosure;

FIG. 3B illustrates a portion of a schematic diagram of one embodiment of an energy storage system according to example aspects of the present disclosure;

FIG. 4 illustrates a flow diagram of one embodiment of a method for controlling an energy storage system according to example aspects of the present disclosure; and FIG. 5 illustrates a flow diagram of another embodiment of a method for controlling an energy storage system according to example aspects of the present disclosure.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to systems and methods for controlling an energy storage system to increase an allowable system current of the energy storage system. Energy storage systems, such as power conditioning systems, can include a plurality of parallel-connected energy storage devices. These energy storage devices can be, for example, battery wings or battery strings. For example, a battery wing can include a plurality of battery strings, wherein each battery string includes a plurality of battery cells. Each battery string in a battery wing can be connected to a common bus, and each battery string can operate at a common voltage. The battery strings can be connected in parallel, which can allow each battery string to contribute a current, which can be summed at the common bus. Further, a plurality of battery wings can be connected in parallel, and connected to a common bus, thereby allowing each battery wing to contribute a current that is summed at the common bus. In some energy storage systems, such as a power conditioning system, the current from an energy storage system can be provided to one or more converters to convert the power to another type of power, such as an alternating-current power or power at a different voltage.

Energy storage systems commonly include controllers, such as plant controllers. The controllers, which can include processors and memory, can be configured to control various aspects of the energy storage system, such as connecting or disconnecting various energy storage elements or determining operating parameters of the energy storage system, such as currents, voltages, states-of-charge, temperatures, resistances, current limit ratings, or other operational parameters. For example, controllers commonly determine an allowable system current for the energy system. The allowable system current can be determined by, for example, determining an allowable system current that will prevent any energy storage device in the system from operating above the current rating for the energy storage device. For example, an energy storage device, such as a battery string or a battery wing, may have a current rating due to a fuse, a conductor capacity, or inherent current limit of the energy storage device. A controller, such as a plant controller, can determine an allowable system current for the energy storage system such that no individual current rating is exceeded when the system is operated.

For example, during operation, an individual battery string may be operating close to the current rating for that particular battery string (i.e., the battery string may be "threatened"). A controller, such as a plant controller, can be configured to determine that the threatened battery string is approaching its current rating by monitoring a current in the battery string and comparing it to the current rating for the battery string. In order to prevent the threatened battery string from exceeding its current rating, a typical approach is for the controller to dynamically adjust the allowable system current of the energy storage system down (i.e., derate the allowable system current) to a point such that the current in the threatened battery string will not exceed its current rating. This can be done by, for example, setting an allowable system current that corresponds to the current in threatened battery string reaching but not exceeding the current rating for the threatened battery string.

Due to variations of the internal resistance of the battery strings in the system caused by, for example, aging, states-of-charge, temperature, or other parameters, some battery strings in the system may not be operating as close to their respective current rating. Because the parallel-connected battery strings are operating at a common voltage, the individual currents can vary for each battery string based on their respective resistances. Thus, setting an allowable system current for the energy storage system corresponding to 100% of a current rating for a threatened battery string may cause other battery strings to operate at lower current levels (e.g., 80% of their respective current ratings). Accordingly, when the allowable system current is set based on the threatened battery string, the total power production capacity for the energy storage system may be reduced since individual battery strings may have energy capacity that is not usable.

The systems and methods according to example aspects of the present disclosure can allow for an increased allowable system current for an energy storage system, and consequently, an increased power production capacity. For example, a controller can be configured to determine an energy storage device which limits an allowable system current. In an embodiment, a controller can determine the limiting energy storage device by comparing a value of a current in the limiting energy storage device to a current rating for the limiting energy storage device. The limiting energy storage device can be, for example, a battery wing or a battery string in an energy storage system operating above, at, or closest to the current rating for the limiting energy storage device. The current rating can be set based upon one or more parameters, such as a maximum current value for a fuse, a conductor connecting the energy storage device to the energy storage system, or an internal rating of the energy storage device itself, such as a current rating for a battery string.

Once the controller has determined the limiting energy storage device for the energy storage system, the controller can be further configured to determine an adjusted allowable system current based on modifying one or more operational parameters of the limiting energy storage device. For example, the controller can be configured to determine a allowable system current when various operational parameters of the limiting energy storage device are modified, such as if the limiting energy storage device from the energy storage system were disconnected, a temperature of the limiting energy storage device were decreased, a state-of-charge of the limiting energy storage device were modified, or a position of the limiting energy storage device in the energy storage system were modified.

For example, a controller can be configured to determine an allowable system current when the limiting energy storage device is disconnected from the energy storage system by first determining a resistance of each energy storage device based on a current and voltage for each energy storage device. In an embodiment, the controller can determine the resistances by obtaining current and voltage values for each energy storage device, such as a current in a battery string and a voltage at a bus the battery string is connected to, and dividing the voltage value by the current value. The controller can further be configured to determine a modified energy storage system resistance with the limiting energy storage device disconnected from the energy storage system by modelling the system with the limiting energy storage device disconnected using known relationships. The controller can then further determine a allowable system current for the energy storage system based on the modified energy storage system resistance.

Further, in an embodiment, a controller can be configured to determine an allowable system current when the temperature of the limiting energy storage device is decreased. Due to battery cell chemistry, when an energy storage device such as a battery string is cooled, the internal resistance of the battery will increase. In an embodiment, a controller can be configured to determine a temperature of the limiting energy storage device by, for example, obtaining one or more measurements from a thermometer in close proximity to the limiting energy storage device. The controller can further be configured to estimate a resistance of the limiting energy storage device when the limiting energy storage device is operated at a decreased temperature. For example, a first principles model of the effect that a battery cell temperature has on resistance can be used. The controller can further be configured to determine a modified energy storage system resistance with the limiting energy storage device operating at the decreased temperature by, for example, modelling the energy storage system using known relationships. Further, the controller can be configured to determine a allowable system current for the energy storage system based on the modified energy storage system resistance.

In an embodiment, a controller can be configured to determine an allowable system current based at least in part on modifying a state-of-charge of the limiting energy storage device. For example, a controller can be configured to determine a state-of-charge of the limiting energy storage device using known methods. The controller can further be configured to estimate a resistance of the limiting energy storage device operating at a modified state-of-charge by, for example, using a multi-point interpolation model. The controller can further be configured to determine a modified energy storage system resistance with the limiting energy storage device operating at the modified state-of-charge using known relationships. The controller can then determine an allowable system current for the energy storage system based on the modified energy storage system resistance.

In an embodiment, a controller can be configured to determine an allowable system current based with the limiting energy storage device in a modified position in the energy storage system. For example, a battery string could be physically removed from a first battery wing and inserted into a second battery wing. In an embodiment, a network of switches and busses can be used to electrically connect the limiting energy storage device to a particular point in the energy storage system, thereby changing the topography of the energy storage system. For example, a controller can be configured to determine a resistance of each energy storage device based on a current and voltage for each energy storage device. The controller can further be configured to determine a modified energy storage system resistance with the limiting energy storage device connected at a modified position in the energy storage system. The controller can further be configured to determine a allowable system current for the energy storage system based on the modified energy storage system resistance.

Once the controller has determined one or more allowable system currents with one or more operational parameters of the limiting energy storage device modified, the controller can be configured to determine a modified operational parameter for the limiting energy storage device to increase the allowable system current of the energy storage system. For example, in an embodiment, the controller can be configured to select a modified operational parameter such that the allowable system current is the highest for the modified operational parameters that were evaluated by the controller. This can be done by, for example, comparing the allowable system currents determined by the controller for each of the evaluated modified operational parameters of the limiting energy storage device. For example, a controller can be configured to determine that disconnecting the limiting energy storage device results in the highest allowable system current, whereas changing a temperature or state-of-charge would not. The controller can be configured to select a modified operational parameter for the limiting energy storage device to increase the allowable system current of the system by, for example, selecting disconnecting the limiting energy storage device as the modified operational parameter.

In an embodiment, the controller can be configured to additionally determine an impact to a usable capacity of the energy storage system when the limiting energy storage device is operated at the modified operational parameter. For example, in some instances, a user of the energy storage system may use the system to provide back-up power to non-critical machinery. In such a case, the user may have a preference that the energy storage system be operated such that the operational lifetime of the energy storage system is preferentially increased compared to a maximum power output. In another instance, a user of an energy storage system may use the system to provide back-up power to critical machinery, and may have a preference that the energy storage system be operated to maximize the available power when the energy storage system is needed due to an interruption of normal power operations. In an embodiment, a controller can be configured to determine an effect of operating a limiting energy storage device at an adjusted operational state, by, for example, determining an effect of operating an energy storage system at an allowable system current on an operational lifetime of the system. Further, in an embodiment, a controller can be configured to select a modified operational parameter of the limiting energy storage element subject to a constraint on the usable capacity of the energy storage system. For example, if disconnecting a limiting energy storage device would allow the energy storage system to operate at an allowable system current that would reduce the operational lifetime of the energy storage system, whereas modifying a temperature of the limiting energy storage device would not, a controller can be configured to select a modified operational parameter for the limiting energy storage device subject to a constraint on the useable capacity of the energy storage system, by, for example selecting a modified temperature as the modified operational parameter for the limiting energy storage device.

Further, a controller can be configured to control the limiting energy storage device to the modified operational parameter. In an embodiment, the controller can be configured to dynamically control the limiting energy storage device, by, for example, disconnecting the limiting energy storage device by opening a switch, turning on a cooling system to reduce the temperature of the limiting energy storage device, driving the state-of-charge of the limiting energy storage device to a modified state-of-charge, or using a network of switches and busses to electrically connect the limiting energy storage device to another physical location in the energy storage system. In an embodiment, the controller can further be configured to output a control action to be performed by a user, such as by outputting a modified physical location for the limiting energy storage device to be connected to by a technician at the next scheduled maintenance period.

In this way, the systems and methods of the present disclosure can have a technical effect of increasing an allowable system current in an energy storage system. Further, the systems and methods of the present disclosure can allow for an increased useable capacity of the energy storage system, while still operating within certain constraints, such as a current rating for an energy storage device or a user preference to increase an operational lifetime of the energy storage system.

With reference now to the FIGS., example embodiments of the present disclosure will be discussed in further detail. FIG. 1 depicts an example hybrid generator-battery power system 100 that may implement one or more energy storage systems according to example aspects of the present disclosure. Thus, FIG. 1 is provided for illustrative purposes only and is not meant to limit the present disclosure to a particular application. Rather, the systems and methods of the present disclosure can be utilized in any power system. As shown in FIG. 1, the illustrated embodiment depicts multiple sources of power including an AC power grid, an engine-generator power source or engine-generator set (EGS) 120 and a battery power source 140, which is an energy storage system (ESS). A transfer switch 115 allows transfer of operation between the AC grid power and the EGS 120, as well as other AC electrical power that may be available. The EGS 120 typically runs on fuel (e.g., diesel fuel) provided by a fuel source 125 (e.g., a storage tank). An availability switch 135 allows for alternate energy sources 130 (e.g. solar, wind, or fuel cell), if available, to be switched in to a DC bus 145 or an AC bus 155 of the power system 100 as well. If switching into the AC bus 155, a converter 170 (described below) can be coupled between the alternate energy source 130 and the AC bus 155.

The energy storage system 140 is an electrical power source. More specifically, in certain embodiments, the energy storage system 140 may include one or more energy storage devices 142. For example, the one or more energy storage devices 142 can be one or more battery wings, wherein each battery wing includes a plurality of parallel-connected battery strings. The one or more energy storage devices 142 can also be one or more battery strings, wherein each battery string includes a plurality of series-connected battery cells. The energy storage devices 142 may include lithium ion batteries, sodium nickel chloride batteries, sodium sulfur batteries, nickel metal hydride batteries, nickel cadmium batteries, fuel cells, super capacitors, or similar.

The AC bus 155 provides AC power to drive AC loads 160 of the system such as, for example, lighting and/or air conditioning for the system 100. Furthermore, the AC bus 155 can provide AC power to a convertor 170 which converts AC power to DC power and provides the DC power to the DC bus 145 to drive DC loads 180 of the power system 100 such as the radios, switches, and amplifiers of the power system 100. The DC bus 145 also provides DC power from the converter 170 to recharge the energy storage system 140 and provides DC power from the energy storage system 140 to the DC loads 180 as the energy storage system 140 discharges. A controller 190 may be configured to monitor and/or control various aspects of the system 100, such as commanding the engine of the EGS 120 to turn on or off in accordance with a control logic of the controller 190. In accordance with various embodiments, the controller 190 may be a separate unit or may be part of a plant controller 144 of the energy storage system 140.

The converter 170 can be a rectifier or regulator, and may regulate DC power from a DC electrical power source (e.g., a solar energy system or a fuel cell energy system) instead of an AC electrical power source. The terms "rectifier" and "regulator" are used broadly herein to describe a device that conditions energy from a primary power source to provide DC electrical power to DC loads (e.g., DC loads 180) and to an ESD (e.g., the energy storage system 140). In general, a primary power source may provide AC or DC electrical power that is used by an ESD (e.g., by the DC energy storage system 140) of the power system 100. In certain embodiments, the energy storage system 140 can be a power conditioning system, which can include one or more converters 170.

During operation, when the EGS 120 is on, the EGS 120 provides power to the DC loads 180 and to the energy storage system 140 during a charging part of the cycle. When the EGS 120 is off, the energy storage system 140 provides power to the DC loads 180 during a discharging part of the cycle. The state of the energy storage system 140 can be estimated by observations of the current of the energy storage system 140.

As shown particularly in FIGS. 1 and 2, the energy storage system 140 may be controlled by the plant controller 144. More specifically, FIG. 2 illustrates a block diagram of one embodiment of components that may be included in a controller (such as controller 190 or a plant controller 144) that can be part of the power system 100 of FIG. 1. For example, in several embodiments, the plant controller 144 is configured to monitor and/or control operation of the energy storage system 140. In addition, in accordance with the present disclosure, the plant controller 144 may be configured to communicate with the EGS 120 by sending a start-up command to a starter battery 124 so as to start-up the engine of the EGS 120 in accordance with control logic of the plant controller 144. The plant controller 144 may also provide control logic for operation of any other components of the energy storage system 140. For example, the plant controller 144 may be, for example, a logic controller implemented purely in hardware, a firmware-programmable digital signal processor, or a programmable processor-based software-controlled computer.

More particularly, as shown in FIG. 2, the plant controller 144 (or the controllers 190) can include any number of control modules. As shown, for example, the plant controller 144 can include one or more processor(s) 172 and associated memory device(s) 174 configured to perform a variety of computer-implemented functions and/or instructions (e.g., performing the methods, steps, calculations and the like and storing relevant data as disclosed herein). The instructions when executed by the processor 172 can cause the processor 172 to perform operations, including providing control commands to the energy storage devices 142 and/or other aspects of the system 100. Additionally, the plant controller 144 may also include a communications module 176 to facilitate communications between the plant controller 144 and the various components of the system 100. Further, the communications module 176 may include a sensor interface 178 (e.g., one or more analog-to-digital converters) to permit signals transmitted from one or more sensors 126, 128 to be converted into signals that can be understood and processed by the processors 172. It should be appreciated that the sensors (e.g. sensors 126, 128) may be communicatively coupled to the communications module 176 using any suitable means. For example, as shown in FIG. 2, the sensors 126, 128 are coupled to the sensor interface 178 via a wired connection. However, in other embodiments, the sensors 126, 128 may be coupled to the sensor interface 178 via a wireless connection, such as by using any suitable wireless communications protocol known in the art. As such, the processor 172 may be configured to receive one or more signals from the sensors 126, 128.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 172 is also configured to compute advanced control algorithms and communicate to a variety of Ethernet or serial-based protocols (Modbus, OPC, CAN, etc.). Additionally, the memory device(s) 174 may generally include memory element(s) including, but not limited to, non-transitory computer-readable media (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 174 may generally be configured to store suitable computer-readable instructions that, when implemented by the processor(s) 172, configure the plant controller 144 to perform the various functions as described herein. In an embodiment, one or more processors 172 and one or more memory devices 174 can be included in a control system.

Referring now to FIGS. 3A AND 3B, a schematic diagram of an energy storage system 140 according to example aspects of the present disclosure is depicted. The energy storage system 140 can be included in the power system 100 of FIG. 1. As shown, the energy storage system 140 includes a plurality of energy storage devices 142 connected in parallel. As depicted, three energy storage devices 142 are three battery wings 200. Each battery wing 200 can include a plurality of battery strings 202. Each battery string 202 can include, for example, a plurality of series-connected battery cells. As shown, each battery wing 200 includes three battery strings 202. Further, a controller 144 can be communicatively coupled to the plurality of battery wings 200. More specifically, as shown, the controller 144 corresponds to the plant controller 144 as described herein.

Each battery wing can include a plurality of sensors. For example, a current sensor 204 can be configured to measure a current in each battery string 202 ("IBATT"). Further, a current sensor 204 can be configured to measure a current in each battery wing 200 ("IBW"), and for the entire energy storage system ("IESS"). The IESS can be subject to an allowable system current rating set by a controller, such as a plant controller 144, which can be an upper limit for the IESS. The current from each battery string 202 can flow to a common bus 206. Each battery wing can have a common bus 206, which can combine the individual currents from each battery string 202. Each battery string 202 can be connected to the common bus 206 by one or more switches 210. Each switch 210 can be in operative communication with a plant controller 144 for the energy storage system 140. For example, each switch 210 can be configured to open or close when a plant controller 144 sends a command signal to the switch 210. Each battery wing 200 can further include a voltage sensor 208, which can measure a voltage of the common bus 206 for each battery wing 200. In an embodiment, each battery string 202 can have a voltage sensor 208 configured to measure a voltage associated with the battery string 202.

Similarly, the energy storage system 140 can include a common bus 206 wherein the current from each battery wing 200 flows, which can combine the individual currents from each battery wing 200. Each battery wing 200 can be connected to the common bus 206 by one or more switches 210. Each switch 210 can be in operative communication with a plant controller 144 for the energy storage system 140. For example, each switch 210 can be configured to open or close when a plant controller 144 sends a command signal to the switch 210. Further, the energy storage system 140 can include a voltage sensor 208 to measure the voltage at the common bus 206 for the battery wings 200. In an embodiment, each battery wing 200 can have a voltage sensor 208 configured to measure a voltage associated with the battery wing 200. The plant controller 144 can be communicatively coupled to one or more sensors, such as one or more current sensors 204 or one or more voltage sensors 208. Further, sensors 204 and 208 can correspond to sensors 126 and 128, as shown in FIG. 2.

The energy storage system 140 depicted in FIGS. 3A AND 3B is intended for illustrative purposes only. One skilled in the art will recognize that any number of energy storage devices 142 can be connected in parallel and benefit from the example aspects of the present disclosure. For example, the energy storage devices 142 could be a plurality of battery strings 202 rather than a plurality of battery wings 200. Further, any number of battery strings 202 or battery wings 200 could be connected in parallel. Further, each energy storage device, such as a battery wing 200 could include a controller for that energy storage device, which can be in operative communication with the plant controller 144. In an embodiment, a single controller, such as a plant controller 144, can perform the functions of a controller for each energy storage device.

As mentioned, the plant controller 144 can be configured to perform a variety of computer-implemented functions and/or operations. More specifically, as shown in FIG. 4, a flow diagram illustrating a method (400) according to example aspects of the present disclosure is depicted. The method (400) can be used, for example, to control an energy storage system to increase an allowable system current of the energy storage system. The method (400) can be performed by one or more controllers, such as, for example, a plant controller 144.

At (402), the method (400) can include determining a limiting energy storage device. For example, an energy storage system can include a plurality of parallel connected energy storage devices 142, such as battery wings 200 or battery strings 202. The plurality of energy storage devices 142 can be connected in parallel to a common bus. Each energy storage device 142 can have, for example, a current rating. The current rating can be due to, for example, a fuse, a conductor capacity, or an inherent current limit for the energy storage device. The controller can be configured to determine a limiting energy storage device by, for example, being communicatively coupled to one or more sensors in the energy storage system. For example, each energy storage device 142 can have a current sensor associated with the energy storage device 142. The controller can be configured to receive one or more measurements from the current sensors in the energy storage system. Further, the controller can be configured to determine a limiting energy storage device based on a current rating for the energy storage device by comparing a current measurement for the energy storage device to the current rating for the energy storage device. In an embodiment, the controller can be configured to determine a limiting energy storage device by determining an energy storage device operating above, at, or closest to the current rating for the energy storage device.

At (404), the method (400) can include determining an adjusted allowable system current for one or more modified operational parameters of the limiting energy storage device. For example, the controller can be configured to determine an adjusted allowable system current when one or more of the following operational parameters are modified: disconnecting the limiting energy storage device from the energy storage system, decreasing a temperature of the limiting energy storage device, modifying a state-of-charge of the limiting energy storage device, or modifying a position of the limiting energy storage device in the energy storage system. In certain embodiments, one or more operational parameters of the limiting energy storage device can be estimated using known relationships. For example, a state-of-charge (SOC) and/or the resistance of the energy storage devices 142 may be estimated by using a multi-point interpolation model based on an open circuit voltage, or a resistance of the energy storage devices 142 can be estimated using a first principles model of the effect of temperature on one or more battery cells. In still further embodiments, any other suitable method may be used to estimate the operating parameters of the energy storage devices 142, such as by calculating such parameters using known formulas and measurements from one or more sensors located in the energy storage system.

For example, a controller can be configured to determine an allowable system current when the limiting energy storage device is disconnected from the energy storage system by first determining a resistance of each energy storage device based on a current and voltage for each energy storage device. For example, a controller can receive current measurements from current sensors associated with each energy storage device and voltage measurements from a voltage sensor connected to a common bus. A resistance for each energy storage device can be determined by dividing the voltage value by a current value. The controller can further be configured to determine a modified energy storage system resistance with the limiting energy storage device disconnected from the energy storage system by modelling the system with the limiting energy storage device disconnected using known relationships. Based on the modified energy storage system resistance, the controller can then further determine an allowable system current for the energy storage system.

Similarly, a controller can be configured to determine an allowable system current when the temperature of the limiting energy storage device is decreased. In an embodiment, a controller can be configured to determine a temperature of the limiting energy storage device by, for example, obtaining one or more measurements from a temperature sensor in close proximity to the limiting energy storage device. The controller can further be configured to estimate a resistance of the limiting energy storage device when the limiting energy storage device is operated at a decreased temperature. For example, a first principles model can be used to determine the effect that a lowering the temperature of the limiting energy storage device would have on the resistance of the limiting energy storage device. The controller can further be configured to determine a modified energy storage system resistance with the limiting energy storage device operating at the decreased temperature by, for example, modelling the energy storage system using known relationships. For example, a plurality of energy storage devices could have the same current rating, but have different currents due to variations in resistance for the energy storage devices. The controller could be configured to determine a resistance for other energy storage devices connected in parallel to the limiting energy storage device. The controller could then model the effect of reducing the temperature of the limiting energy storage device, thereby increasing the resistance of the limiting energy storage device, and determine a modified temperature for the limiting energy storage device such that the resistances of all parallel-connected energy storage devices approaches a common resistance value. Because each energy storage device would be operating at a common voltage, the currents for the energy storage devices would tend to equalize, and therefore the energy storage device would approach their current rating in a more uniform manner. Additionally and/or alternatively, the controller can be configured to determine any temperature level that increases an allowable system current of the energy storage system. Further, the controller can be configured to determine a allowable system current for the energy storage system based on the modified energy storage system resistance.

In an embodiment, a controller can be configured to determine an allowable system current based at least in part on modifying a state-of-charge of the limiting energy storage device. For example, a controller can be configured to determine a state-of-charge of the limiting energy storage device using known methods, such as measuring current over a period of time or other methods. The controller can further be configured to estimate a resistance of the limiting energy storage device operating at a modified state-of-charge by, for example, using a multi-point interpolation model. For example, the resistance of an energy storage device, such as a battery string, can be known for various states-of-charge. The controller can be configured to measure a resistance of the limiting energy storage device as well as the resistance of any other parallel-connected energy storage devices, and based on the relationship between the state-of-charge of the limiting energy storage device and its resistance, the controller can be configured to determine a state-of-charge level corresponding to a similar resistance the other parallel-connected energy storage devices. Additionally and/or alternatively, the controller can be configured to determine any state-of-charge level that increases an allowable system current of the energy storage system. The controller can further be configured to determine a modified energy storage system resistance with the limiting energy storage device operating at the modified state-of-charge using known relationships. The controller can then determine an allowable system current for the energy storage system based on the modified energy storage system resistance.

In an embodiment, a controller can be configured to determine an allowable system current with the limiting energy storage device in a modified position in the energy storage system. The controller can be configured to first determine a resistance of each energy storage device based on a current and voltage for each energy storage device using the methods described herein. In an embodiment, the controller can be configured to determine a modified energy storage system resistance with the limiting energy storage device connected at a modified position in the energy storage system. For example, a limiting energy storage device 142 may be a battery string 202 physically located in a first battery wing 200. The resistance of the battery string 200, however, may more closely match the resistances of battery strings 202 located in a second battery cabinet 200. The controller can be configured to determine a modified energy storage system resistance with the limiting energy storage device in a modified position, such as the second battery cabinet 200. Additionally and/or alternatively, the controller can be configured to determine any modified position that increases an allowable system current of the energy storage system. Further, the controller can be configured to determine an allowable system current for the energy storage system based on the modified energy storage system resistance using known methods.

At (406), the method (200) can include determining an impact to a usable capacity of the energy storage system when the limiting energy storage device is operated at one or more modified operational parameters. For example, operating the energy storage system at higher currents, and therefore higher power outputs, can negatively impact the operational lifetime of one or more energy storage devices in the system. A user of the energy storage system may have a preference that the operation of the energy storage system be biased in favor of the useful lifetime of the energy storage system as compared to a maximizing or increasing a power output. Therefore, the user may decide that the energy storage system should be operated such that a threshold power output is not exceeded, or such that a threshold is only exceeded at certain rates or during certain operational conditions. In an embodiment, the controller can be configured to determine an effect of operating the limiting energy storage device at one or more modified operational parameters, by, for example, determining an effect of operating an energy storage system at an allowable system current on an operational lifetime of the system using known relationships.

At (408), the method (400) can include determining a modified operational parameter of the limiting energy storage device. For example, in an embodiment, the controller can be configured to select a modified operational parameter such that the allowable system current is the highest for the modified operational parameters that were evaluated by the controller. This can be done by, for example, comparing the allowable system currents determined by the controller for each of the evaluated modified operational parameters of the limiting energy storage device. For example, a controller can be configured to determine that disconnecting the limiting energy storage device results in the highest allowable system current, whereas changing a temperature or state-of-charge would not. The controller can be configured to determine a modified operational parameter for the limiting energy storage device to increase the allowable system current of the system by, for example, selecting disconnecting the limiting energy storage device as the modified operational parameter.

Further, in an embodiment, a controller can be configured to determine a modified operational parameter for the limiting energy storage element subject to a constraint on the usable capacity of the energy storage system. For example, if disconnecting a limiting energy storage device would allow the energy storage system to operate at an allowable system current that would reduce the operational lifetime of the energy storage system, whereas modifying a temperature of the limiting energy storage device would not, a controller can be configured to determine a modified operational parameter for the limiting energy storage device subject to a constraint on the useable capacity of the energy storage system, by, for example, selecting a modified temperature as the modified operational parameter for the limiting energy storage device.

At (410), the method (400) can include controlling the limiting energy storage device based at least in part on the modified operational parameter. In an embodiment, the controller can be configured to dynamically control the limiting energy storage device, by, for example, disconnecting the limiting energy storage device by opening a switch, turning on a cooling system to reduce the temperature of the limiting energy storage device, driving the state-of-charge of the limiting energy storage device to a modified state-of-charge, or using a network of switches and busses to electrically connect the limiting energy storage device to another physical location in the energy storage system. In an embodiment, the controller can further be configured to output a control action to be performed by a user, such as by outputting a modified physical location for the limiting energy storage device to be connected to during a scheduled maintenance check by a technician.

Referring now to FIG. 5, a flow diagram illustrating a method (500) of controlling an energy storage system according to example aspects of the present disclosure is depicted. In an embodiment, the method (500) can be implemented by one or more control systems. The one or more control systems can include one or more processors and one or more memory devices storing instructions that when executed by the one or more processors cause the one or more processors to perform operations, such as the method (500). As mentioned, an energy storage system 140 can include a plurality of parallel-connected energy storage devices 142, such as battery wings 200 or battery strings 202. Thus, as shown at (502), the method (500) includes operating the energy storage system 140 at a first allowable system current.

At (504), the method (500) can include determining a limiting energy storage device. The limiting energy storage device can be based at least in part on a current rating for the limiting energy storage device. At (506), the method (500) can include determining, by the one or more controllers, a second allowable system current based at least in part on disconnecting the limiting energy storage device from the energy storage system. At (508), the method (500) can include determining a third allowable system current based at least in part on decreasing a temperature of the limiting energy storage device. At (510), the method (500) can include determining a fourth allowable system current based on modifying a state-of-charge of the limiting energy storage device. In an embodiment, at (512), the method (500) can include determining a fifth allowable system current based on modifying a position of the limiting energy storage device.

At (514), the method (500) can include determining an impact to a usable capacity of the energy storage system. For example, an impact on a usable capacity for the energy storage system can be determined based on disconnecting the limiting energy storage device from the energy storage system, decreasing a temperature of the limiting energy storage device, modifying a state-of-charge of the limiting energy storage device, and modifying a position of the limiting energy storage device in the energy storage system.

At (516), the method (500) can include determining a modified operational parameter for the limiting energy storage device to increase the allowable system current. For example, a modified operational parameter can be a parameter that has a highest allowable system current. In an embodiment, the modified operational parameter can be a parameter that has a highest allowable system current subject to a constraint on the usable capacity of the energy storage system.

At (518), the method (500) can include determining an increased allowable system current. For example, the allowable system current can be one of the second, third, fourth, or fifth allowable system currents determined previously which corresponds to the modified operational parameter.

At (520), the method (500) can include dynamically controlling the limiting energy storage device based at least in part on the modified operational parameter. For example, the controller can be configured to dynamically control the limiting energy storage device, by, disconnecting the limiting energy storage device by opening a switch, turning on a cooling system to reduce the temperature of the limiting energy storage device, driving the state-of-charge of the limiting energy storage device to a modified state-of-charge, or using a network of switches and busses to electrically connect the limiting energy storage device to another physical location in the energy storage system.

At (522), the method (500) can include operating the energy storage system at the increased allowable system current. For example, a plant controller 144 can operate the energy storage system 140 at the increased allowable system current. It should be understood that the method (500) may further include any of the additional features and/or steps as described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for controlling an energy storage system, the energy storage system comprising a plurality of parallel-connected energy storage devices, the method comprising:
    determining, by one or more controllers, a limiting energy storage device based at least in part on a current rating for the limiting energy storage device;
    determining, by a plurality of controllers, one or more adjusted allowable system currents based at least in part on modifying one or more operational parameters of the limiting energy storage device;
    comparing the plurality of adjusted allowable system currents for each of the one or more operational parameters;
    determining, by the one or more controllers, a modified operational parameter of the limiting energy storage device, based at least in part on the comparison of the plurality of adjusted allowable system currents, to increase the allowable system current of the energy storage system; and
    controlling the limiting energy storage device based at least in part on the modified operational parameter.

2. The method of claim 1, wherein the current rating of the limiting energy storage device is based on a fuse rating, a conductor capacity, or an energy storage device rating.

3. The method of claim 1, wherein the one or more energy storage devices comprise one or more battery wings or one or more battery strings.

4. The method of claim 1, wherein determining, by the one or more controllers, the limiting energy storage device based at least in part on the current rating for the limiting energy storage device comprises determining an energy storage device operating above, at, or closest to the current rating for the energy storage device.

5. The method of claim 1, wherein modifying one or more operational parameters comprise one or more of the following: disconnecting the limiting energy storage device from the energy storage system, decreasing a temperature of the limiting energy storage device, modifying a state-of-charge of the limiting energy storage device, and modifying a position of the limiting energy storage device in the energy storage system.

6. The method of claim 5, wherein determining, by the one or more controllers, an adjusted allowable system current based at least in part on disconnecting the limiting energy storage device further comprises:
determining a resistance of the limiting energy storage device based at least in part on a current and voltage for each energy storage device;
determining a modified energy storage system resistance with the limiting energy storage device disconnected from the energy storage system; and
determining an allowable system current for the energy storage system based on the modified energy storage system resistance.

7. The method of claim 5, wherein determining, by the one or more controllers, an adjusted allowable system current based at least in part on decreasing a temperature of the limiting energy storage device further comprises:
determining a temperature of the limiting energy storage device;
estimating a resistance of the limiting energy storage device operating at a decreased temperature;
determining a modified energy storage system resistance with the limiting energy storage device operating at the decreased temperature; and
determining an allowable system current for the energy storage system based on the modified energy storage system resistance.

8. The method of claim 5, wherein determining, by the one or more controllers, an adjusted allowable system current based at least in part on modifying a state-of-charge of the limiting energy storage device further comprises:
estimating a state-of-charge of the limiting energy storage device;
estimating a resistance of the limiting energy storage device operating at a modified state-of-charge;
determining a modified energy storage system resistance with the limiting energy storage device operating at the modified state-of-charge; and
determining an allowable system current for the energy storage system based on the modified energy storage system resistance.

9. The method of claim 5, wherein determining, by the one or more controllers, an adjusted allowable system current based at least in part on modifying a position of the limiting energy storage device in the energy storage system further comprises:
determining a resistance of the limiting energy storage device based at least in part on a current and voltage for each energy storage device;
determining a modified energy storage system resistance with the limiting energy storage device connected at a modified position in the energy storage system; and
determining an allowable system current for the energy storage system based on the modified energy storage system resistance.

10. The method of claim 1, wherein determining, by the one or more controllers, the modified operational parameter of the limiting energy storage device to increase the allowable system current of the energy storage system comprises selecting an evaluated modified operational parameter of the limiting energy storage device with the highest allowable system current.

11. The method of claim 1, further comprising:
determining an impact to a usable capacity of the energy storage system when the limiting energy storage device is operated at the modified operational parameter.

12. The method of claim 11, wherein determining, by the one or more controllers, the modified operational parameter of the limiting energy storage device comprises selecting the evaluated modified operational parameter with the highest allowable system current subject to a constraint on the usable capacity of the energy storage system.

13. The method of claim 1, wherein the one or more controllers are configured to dynamically control the limiting energy storage device to the modified operational parameter.

14. The method of claim 1, wherein the one or more controllers are configured to output a control action to be performed by a technician.

15. An energy storage system, comprising:
a plurality of energy storage devices connected in parallel, each of the energy storage devices comprising a battery wing or a battery string, each battery wing comprising a plurality of parallel-connected battery strings; and
a controller communicatively coupled to the plurality of energy storage devices, the controller configured to perform one or more operations, the one or more operations comprising:
determining a limiting energy storage device based at least in part on a current rating for the limiting energy storage device;
determining a plurality of adjusted allowable system currents based at least in part on modifying one or more operational parameters of the limiting energy storage device;
comparing the one or adjusted allowable system currents for each of the plurality of modified operational parameters;
determining a modified operational parameter of the limiting energy storage device, based at least in part on the comparison of the plurality of adjusted allowable system currents, to increase the allowable system current of the energy storage system; and
controlling the limiting energy storage device based at least in part on the modified operational parameter.

16. The system of claim 15, wherein modifying one or more operational parameters comprise one or more of the following: disconnecting the limiting energy storage device from the energy storage system, decreasing a temperature of the limiting energy storage device, modifying a state-of-charge of the limiting energy storage device, and modifying a position of the limiting energy storage device in the energy storage system.

17. A control system for controlling an energy storage system, the energy storage system comprising a plurality of parallel-connected energy storage devices, the control system comprising one or more processors and one or more memory devices, the one or more memory devices storing instructions that when executed by the one or more processors cause the one or more processors to perform operations, the operations comprising:
operating the energy storage system at a first allowable system current;
determining, by one or more controllers, a limiting energy storage device based at least in part on a current rating for the limiting energy storage device;

determining, by the one or more controllers, a second allowable system current based at least in part on disconnecting the limiting energy storage device from the energy storage system;

determining, by the one or more controllers, a third allowable system current based at least in part on decreasing a temperature of the limiting energy storage device;

determining, by the one or more controllers, a fourth allowable system current based at least in part on modifying a state-of-charge of the limiting energy storage device;

determining, by the one or more controllers, a modified operational parameter for the limiting energy storage device such that the allowable system current at the modified operational parameter is increased compared to the first allowable system current;

determining, by the one or more controllers, an increased allowable system current for the energy storage system;

dynamically controlling, by the one or more controllers, the limiting energy storage device based at least in part on the modified operational parameter; and operating the energy storage system at the increased allowable system current.

18. The method of claim 17, further comprising:
determining a fifth allowable system current based on modifying a position of the limiting energy storage device.

19. The method of claim 17, further comprising:
determining an impact to a usable capacity of the energy storage system when the limiting energy storage device is operated at the modified operational parameter.

20. The method of claim 19, wherein determining, by the one or more controllers, the modified operational parameter of the limiting energy storage device comprises selecting the modified operational parameter with the highest allowable system current subject to a constraint on the usable capacity of the energy storage system.

* * * * *